United States Patent
Tamura et al.

(10) Patent No.: US 9,954,078 B2
(45) Date of Patent: Apr. 24, 2018

(54) METHOD FOR MANUFACTURING A SEMICONDUCTOR DEVICE HAVING A SUPER JUNCTION MOSFET

(71) Applicant: FUJI ELECTRIC CO., LTD., Kawasaki-shi, Kanagawa (JP)

(72) Inventors: Takahiro Tamura, Matsumoto (JP); Yasuhiko Onishi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/627,434

(22) Filed: Jun. 19, 2017

(65) Prior Publication Data

US 2017/0294521 A1    Oct. 12, 2017

Related U.S. Application Data

(60) Division of application No. 14/882,423, filed on Oct. 13, 2015, now Pat. No. 9,711,634, which is a (Continued)

(30) Foreign Application Priority Data

Sep. 18, 2013    (JP) ................ 2013-192789

(51) Int. Cl.
*H01L 21/265* (2006.01)
*H01L 29/66* (2006.01)
*H01L 29/06* (2006.01)

(52) U.S. Cl.
CPC ...... *H01L 29/66666* (2013.01); *H01L 21/265* (2013.01); *H01L 29/0634* (2013.01)

(58) Field of Classification Search
CPC ............ H01L 29/7811; H01L 29/1095; H01L 29/7395; H01L 29/66712; H01L 29/66333;
(Continued)

(56) References Cited

U.S. PATENT DOCUMENTS 6,621,132 B2 * 9/2003 Onishi ................ H01L 29/0634
257/330
6,967,374 B1    11/2005 Saito et al.
(Continued)

FOREIGN PATENT DOCUMENTS

JP    H07-226405 A    8/1995
JP    2001-102577 A    4/2001
(Continued)

*Primary Examiner* — Jarrett Stark
(74) *Attorney, Agent, or Firm* — Rabin & Berdo, P.C.

(57) ABSTRACT

A method of manufacturing a super junction MOSFET, which includes a parallel pn layer including a plurality of pn junctions and in which an n-type drift region and a p-type partition region interposed between the pn junctions are alternately arranged and contact each other, a MOS gate structure on the surface of the parallel pn layer, and an n-type buffer layer in contact with an opposite main surface. The impurity concentration of the buffer layer is equal to or less than that of the n-type drift region. At least one of the p-type partition regions in the parallel pn layer is replaced with an $n^-$ region with a lower impurity concentration than the n-type drift region.

3 Claims, 14 Drawing Sheets

Related U.S. Application Data continuation of application No. PCT/JP2014/068632, filed on Jul. 11, 2014.

(58) Field of Classification Search
CPC ........... H01L 29/0882; H01L 29/66121; H01L 29/0878; H01L 29/868; H01L 29/06
See application file for complete search history.

(56) References Cited

U.S. PATENT DOCUMENTS

| | | | |
|---|---|---|---|
| 6,982,459 B2* | 1/2006 | Suzuki | H01L 29/0634 257/329 |
| 7,345,296 B2* | 3/2008 | Tombler, Jr. | B82Y 10/00 257/142 |
| 7,892,924 B1* | 2/2011 | Lee | H01L 29/0634 257/24 |
| 2002/0185705 A1 | 12/2002 | Saitoh et al. | |
| 2004/0142501 A1* | 7/2004 | Nakai | H01L 27/14625 438/22 |
| 2005/0242411 A1* | 11/2005 | Tso | H01L 29/0634 257/480 |
| 2007/0048982 A1 | 3/2007 | Nemoto et al. | |
| 2007/0134474 A1* | 6/2007 | Ahn | G02B 5/22 428/212 |
| 2008/0048280 A1* | 2/2008 | Tsukamoto | H01L 27/1462 257/432 |
| 2008/0050877 A1* | 2/2008 | de Fresart | H01L 29/0634 438/270 |
| 2008/0206964 A1 | 8/2008 | Tombler et al. | |
| 2008/0211020 A1* | 9/2008 | Saito | H01L 29/0634 257/342 |
| 2008/0225142 A1* | 9/2008 | Goto | H01L 27/14621 348/272 |
| 2008/0246096 A1 | 10/2008 | Sakakibara et al. | |
| 2008/0299710 A1 | 12/2008 | Tombler, Jr. et al. | |
| 2009/0079002 A1* | 3/2009 | Lee | H01L 29/0634 257/355 |
| 2009/0085149 A1* | 4/2009 | Ishida | H01L 21/02381 257/499 |
| 2009/0286372 A1 | 11/2009 | de Fresart et al. | |
| 2010/0006927 A1* | 1/2010 | Kocon | H01L 29/0634 257/328 |
| 2010/0176280 A1* | 7/2010 | Yokogawa | G02B 5/201 250/226 |
| 2011/0147829 A1 | 6/2011 | Nakajima | |
| 2014/0124851 A1 | 5/2014 | Gamerith et al. | |

FOREIGN PATENT DOCUMENTS

| | | |
|---|---|---|
| JP | 2003-101022 A | 4/2003 |
| JP | 2004-022716 A | 1/2004 |
| JP | 2006-024690 A | 1/2006 |
| JP | 2007-059801 A | 3/2007 |
| JP | 2008-182054 A | 8/2008 |
| JP | 2008-258313 A | 10/2008 |
| JP | 2012-160753 A | 8/2012 |
| WO | WO-2010/24433 A1 | 3/2010 |

* cited by examiner

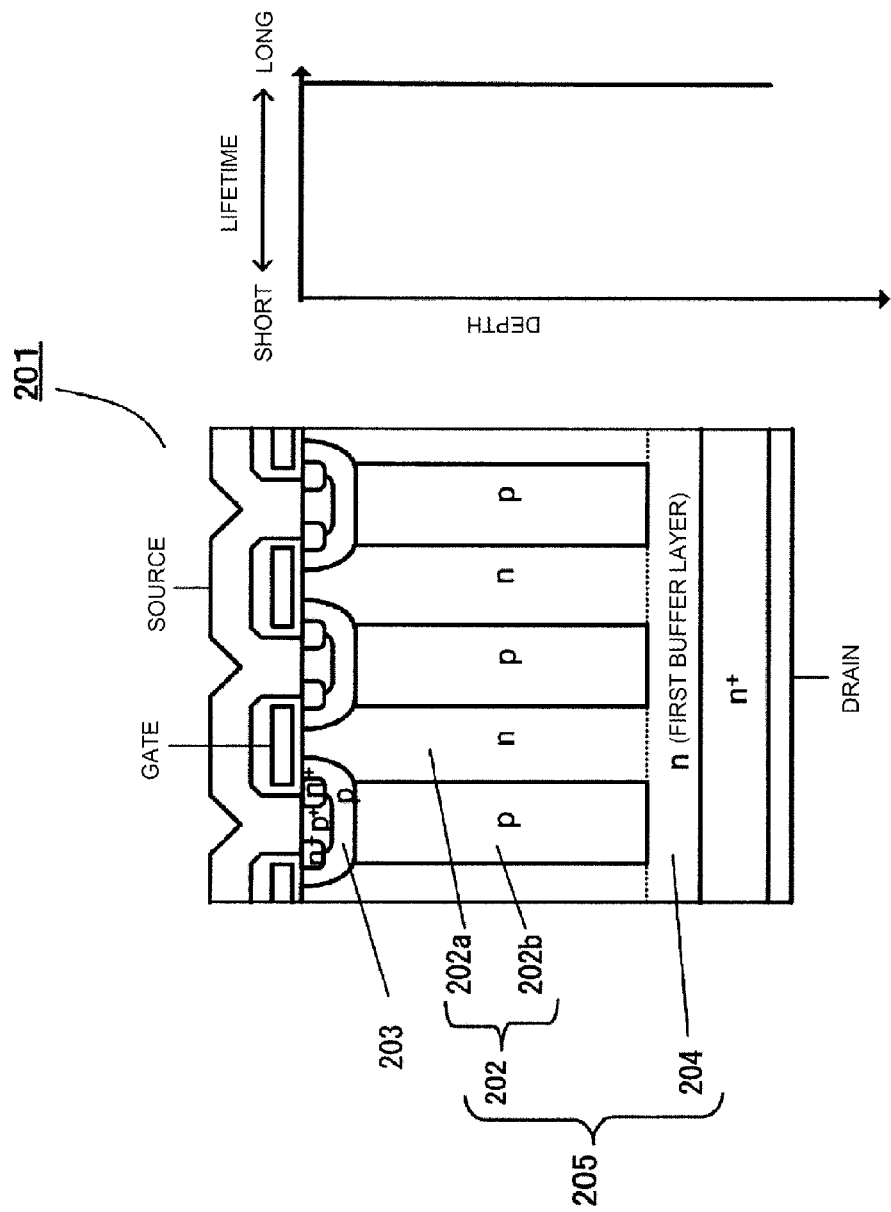

METHOD FOR MANUFACTURING A SEMICONDUCTOR DEVICE HAVING A SUPER JUNCTION MOSFET

This is a division of U.S. patent application Ser. No. 14/882,423, filed on Oct. 13, 2015, and allowed on Mar. 29, 2017, which is a continuation under 35 U.S.C. 120 of International Application PCT/JP2014/068632 having the International Filing Date of Jul. 11, 2014, and having the benefit of the earlier filing date of Japanese Application No. 2013-192789, filed on Sep. 18, 2013. Each of the identified applications is fully incorporated herein by reference.

BACKGROUND

Technical Field

The present invention relates to a semiconductor device (insulated gate field effect transistor) and a method for manufacturing the same.

Background Art

For example, a metal-oxide-semiconductor field effect transistor (MOSFET: insulated gate field effect transistor) or an insulated gate bipolar transistor (IGBT) has been known as a semiconductor element used in a power semiconductor device. FIG. 5 is a circuit diagram illustrating a general inverter. FIG. 6A is a cross-sectional view illustrating a main portion of a general IGBT and FIG. 6B is a cross-sectional view illustrating a main portion of a MOSFET. An IGBT 101 has come into widespread use as a high-breakdown-voltage switching element which is used for an inverter circuit 1000 illustrated in FIG. 5. The IGBT 101 has excellent features, such as the high breakdown voltage and low on-voltage of a bipolar transistor, or excellent features, such as a lower speed than the MOSFET and a high-speed operation, and is an important semiconductor element which supports power electronics now.

However, the IGBT 101 illustrated in the main portion cross-sectional view of FIG. 6A has a reverse breakdown voltage junction (collector junction 103), unlike a MOSFET 301 illustrated in FIG. 6B. Therefore, in general, in the IGBT 101, a current cannot flow in a reverse direction (a bias direction in which an emitter E is a positive electrode and a collector C is a negative electrode). When the IGBT 101 is changed from an on state to a forward blocking state, a high surge voltage is likely to be generated in the reverse direction due to an inductance component in the circuit. When the surge voltage is applied to the IGBT 101, generally, there is a concern that the IGBT 101 which is not protected from a reverse breakdown voltage will be broken. However, when the IGBT is used in the inverter circuit, the IGBT is protected by a diode 401 (see FIG. 5) which is connected in inversely parallel in order to return an L load (dielectric load) current that is generated whenever the IGBT 101 is turned off. Reference numerals 102 and 302 indicate an n⁻ drift layer.

There is an increasing demand for increasing the frequency of the inverter. The parallel connection of the IGBT 101 and the general free-wheeling diode 401 has a limitation in increasing a switching speed. Therefore, the IGBT 101 which can switch at a high speed and a fast diode are used in order to meet the demand. In the fast diode, the time required for reverse recovery when the diode is changed from a state in which a forward current flows to a reverse blocking state is shorter than that of a general diode. The use of the diode makes it possible to reduce reverse recovery loss.

FIG. 2A is a cross-sectional view illustrating a main portion of a super junction MOSFET according to the related art and is a carrier lifetime distribution diagram in which the vertical axis indicates a depth in correspondence with the depth direction of a substrate corresponding to FIG. 2A. In recent years, in order to further improve the speed of the switching element, the replacement of the IGBT 101 with a super junction MOSFET 201 illustrated in FIG. 2A has been examined. The super junction MOSFET 201 (see FIG. 2A) which has been examined as a replacement target has a super junction (SJ) structure having a drift layer 205 as a parallel pn layer in which a n-type region (hereinafter, referred to as an n-type drift region) 202a with high impurity concentration and a p-type region (hereinafter, referred to as a p-type partition region) 202b are alternately arranged in a direction parallel to a main surface of a substrate at a small interval (pitch). In addition, the drift layer includes a first n-type buffer layer 204 which is provided on the drain side of a parallel pn layer 202. When the carrier lifetime of the substrate is not controlled, the carrier lifetime is constant (not controlled) in the depth direction from the surface of the substrate, as illustrated in FIG. 2B. In the super junction MOSFET 201, even when impurity concentration is higher than general impurity concentration in order to match the n-type drift region 202a of the parallel pn layer 202 with the breakdown voltage, the pitch between the parallel pn layers 202 can be reduced to deplete all of the parallel pn layers 202 at a low voltage. Therefore, the super junction MOSFET 201 has the characteristics of a high-breakdown voltage and low on-resistance even though it is a unipolar type. In addition, the super junction MOSFET can perform high-speed switching resulting from a unipolar device and includes a reverse diode structure (reference numerals 203 and 202a in FIG. 2(a)). Therefore, it is not necessary to newly connect the parallel diode 401 of the inverter circuit illustrated in FIG. 5 and a reduction in the size of the device can be expected. In addition, the super junction MOSFET (SJ-MOSFET) 201 is used as a switching device and the built-in diode is used as a fast recovery diode to further increase the speed and to further reduce loss.

As a document related to the super junction MOSFET 201, a document which discloses the following structure has been published: an SJ structure including a parallel pn layer and an n-type buffer layer which is provided below the layer and in which impurity concentration is changed in two stages are provided in a drift layer 205 to reduce on-resistance and to form a built-in diode having a soft recovery waveform as reverse recovery characteristics (for example, see the following Patent Document 1). In addition, a semiconductor device has been known which has an SJ-MOS structure for shortening a reverse recovery time, without increasing a leakage current between a drain and a source (for example, see the following Patent Document 2). Furthermore, a structure has been proposed in which an SJ-MOSFET is connected to a Schottky barrier diode having an SJ structure to achieve a semiconductor device suitable for a soft switching type (for example, see the following Patent Document 3). A structure has been proposed in which a lifetime control region is provided in the entire Schottky barrier diode having an SJ structure to reduce a reverse current and to improve reverse recovery characteristics (for example, see the following Patent Document 4). A lifetime control method for obtaining reverse recovery characteristics with a soft recovery waveform (for example, see the following Patent Document 5). A method for controlling the lifetime of an excess minority carrier has been proposed (for example, see the following Patent Document 6). In addition, a semiconductor device has been proposed which can improve a breakdown voltage and turn-off characteristics, as compared to the elements according to the related art (for example, see the following Patent Document 7).

CITATION LIST

Patent Document

Patent Document 1: JP 2003-101022 A (FIG. 11 and Paragraphs [0077] to [1079])
Patent Document 2: Re-publication of PCT International Publication No. 2010-24433 (Abstract)
Patent Document 3: JP 2006-24690 A (Object and Solving Means in Abstract)
Patent Document 4: JP 2008-258313 A (Abstract)
Patent Document 5: JP 2007-59801 A (Abstract)
Patent Document 6: JP 7-226405 A (Object)
Patent Document 7: JP 2001-102577 A (Object)

In the super junction MOSFET 201 illustrated in FIG. 2A, in the reverse blocking state, the depletion layer is spread into each column (the n-type drift region 202a and the p-type partition region 202b) in the parallel pn layer at a low breakdown voltage and is completely depleted. At that time, the built-in diode (reference numerals 203-202a) is changed from the state in which a forward current (reflux current) to the reverse bias blocking state (that is, a reverse recovery state) of the pn junction of the built-in diode. However, in the built-in diode in the reverse recovery state, since the super junction MOSFET 201 has a unipolar structure, there are few minority carriers and a reverse recovery current Irp is small. Therefore, a so-called hard recovery waveform in which a current waveform and a voltage waveform rise rapidly is likely to be obtained. FIG. 3 which will be described below also illustrates the reverse recovery current waveform of the super junction MOSFET having the structure according to the related art illustrated in FIGS. 2A and 2B. When a reverse recovery operation has a hard recovery waveform, ringing (oscillating waveform) occurs, which causes noise, as illustrated in the reverse recovery waveform diagram of the super junction MOSFET having the structure according to the related art illustrated in FIG. 3 (In FIG. 3, oscillatory waveform portions overlap each other, look like a thick black line, and are indistinct). The waveform of the structure according to the related art illustrated in FIG. 3 is the simulation result of the current waveform of the reverse recovery operation when a power supply voltage is 400 V, a forward current is 20 A, and a change in reverse current over time is 100 A/μs, for the vertical super junction MOSFET 201 having the structure according to the related art illustrated in FIG. 2A.

SUMMARY

The invention has been made in view of the above-mentioned problems and an object of the invention is to provide a semiconductor device which prevents a sharp rise in hard recovery waveform during a reverse recovery operation and a method for manufacturing the same. In addition, an object of the invention is to provide a semiconductor device which can prevent a sharp rise in hard recovery waveform to reduce a reverse recovery current (Irp) and a reverse recovery time (trr) and can achieve high-speed switching and low reverse recovery loss and a method for manufacturing the same.

In order to solve the above-mentioned problems and achieve the object, a semiconductor device according to an aspect of the invention has the following characteristics. A parallel pn layer is provided over a first main surface of a drain layer of a first conductivity type. The parallel pn layer includes a plurality of pn junctions which extend in a vertical direction and are parallel to each other. A drift region of the first conductivity type and a partition region of a second conductivity type which are interposed between the pn junctions are alternately arranged so as to come into contact with each other. A MOS gate structure is provided on a first main surface side of the parallel pn layer. A first buffer layer of the first conductivity type is provided between the parallel pn layer and the drain layer. The first buffer layer has a lower impurity concentration than the drift region. At least one of the partition regions in the parallel pn layer is replaced with a first-conductivity-type region which has a lower impurity concentration than the drift region. A second buffer layer of the first conductivity type may be provided between the first buffer layer and the drain layer. The second buffer layer may have a higher impurity concentration than the drift region. The parallel pn layer may have a lattice-shaped plane pattern.

In order to solve the above-mentioned problems and achieve the object, according to another aspect of the invention, there is provided a method for manufacturing a semiconductor device including a high-concentration buffer layer of a first conductivity type which is provided on a first main surface of a drain layer of the first conductivity type and has a higher impurity concentration than a drift region, a low-concentration buffer layer of the first conductivity type which is provided on the high-concentration buffer layer and has a lower impurity concentration than the drift region, and a parallel pn layer which is provided on the low-concentration buffer layer and in which the drift region of the first conductivity type and a partition region of a second conductivity type are alternately arranged, at least one of the partition regions being replaced with a first-conductivity-type region having a lower impurity concentration than the drift region. The method includes a step of adjusting a carrier lifetime of the parallel pn layer to be shorter than the carrier lifetime of the high-concentration buffer layer, using addition of heavy metal or irradiation with a charged particle.

In order to solve the above-mentioned problems and achieve the object, according to still another aspect of the invention, there is provided a method for manufacturing a semiconductor device including a high-concentration buffer layer of a first conductivity type which is provided on a first main surface of a drain layer of the first conductivity type and has a higher impurity concentration than a drift region, a low-concentration buffer layer of the first conductivity type which is provided on the high-concentration buffer layer and has a lower impurity concentration than the drift region, and a parallel pn layer which is provided on the low-concentration buffer layer and in which the drift region of the first conductivity type and a partition region of a second conductivity type are alternately arranged, at least one of the partition regions being replaced with a first-conductivity-type region having a lower impurity concentration than the drift region. The method has the following characteristics. First, a step of forming the high-concentration buffer layer of the first conductivity type, which has a higher impurity concentration than the drift region, on the first main surface of the drain layer is performed. Then, a step of forming the low-concentration buffer layer of the first conductivity type, which has a lower impurity concentration than the drift region, on the high-concentration buffer layer is performed. Then, a step of forming the parallel pn layer on the low-concentration buffer layer is performed. Then, a step of adding heavy metal or radiating a charged particle to the parallel pn layer such that a carrier lifetime of the parallel pn layer is shorter than the carrier lifetime of the high-concentration buffer layer is performed.

In order to solve the above-mentioned problems and achieve the object, according to yet another aspect of the invention, there is provided a method for manufacturing a semiconductor device including a high-concentration buffer layer of a first conductivity type which is provided on a first main surface of a drain layer of the first conductivity type and has a higher impurity concentration than a drift region, a low-concentration buffer layer of the first conductivity type which is provided on the high-concentration buffer layer and has a lower impurity concentration than the drift region, and a parallel pn layer which is provided on the low-concentration buffer layer and in which the drift region of the first conductivity type and a partition region of a second conductivity type are alternately arranged, at least one of the partition regions being replaced with a first-conductivity-type region having a lower impurity concentration than the drift region. The method has the following characteristics. First, a step of forming the parallel pn layer on a front surface side of a semiconductor substrate is performed. Then, a step of forming an element structure on the parallel pn layer on the front surface side of the semiconductor substrate is performed. Then, a step of forming the low-concentration buffer layer of the first conductivity type, which has a lower impurity concentration than the drift region, on a rear surface side of the semiconductor substrate is performed. Then, a step of forming the high-concentration buffer layer of the first conductivity type, which has a higher impurity concentration than the drift region, at a position that is shallower than the low-concentration buffer layer from a rear surface of the semiconductor substrate is performed. Then, a step of adding heavy metal or radiating a charged particle to the high-concentration buffer layer such that a carrier lifetime of the parallel pn layer is shorter than the carrier lifetime of the high-concentration buffer layer is performed.

According to the invention, it is possible to provide a semiconductor device which prevents a sharp rise in hard recovery waveform during a reverse recovery operation and a method for manufacturing the same. In addition, it is possible to provide a semiconductor device which can operate at a high speed and reduce reverse recovery loss and a method for manufacturing the same.

BRIEF DESCRIPTION OF THE DRAWINGS

FIGS. 2A and 2B are cross-sectional views illustrating a main portion of a super junction MOSFET according to the related art and is a carrier lifetime distribution diagram in which the vertical axis indicates a depth in correspondence with a depth direction of a substrate corresponding to FIG. 2A;

DETAILED DESCRIPTION

Figure 1A:
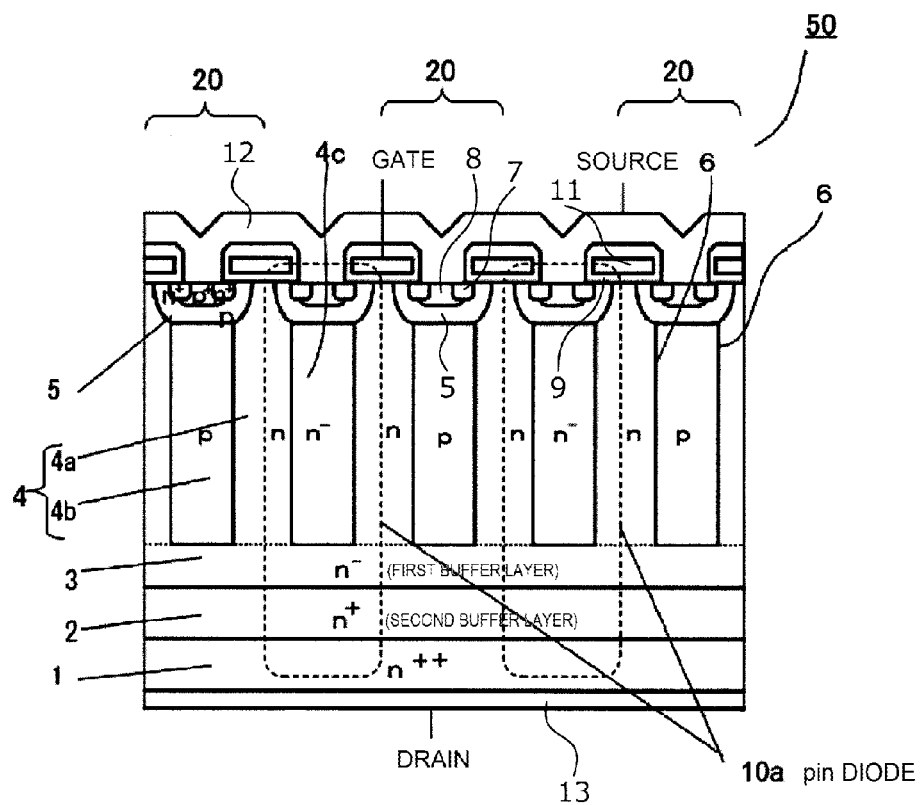
FIGS. 1A and 1B are cross-sectional views illustrating a main portion of a super junction MOSFET according to Embodiment 1 of the invention in which a p-type partition region in a parallel pn layer is replaced with an n-type region having a lower impurity concentration than an n-type drift region.

Hereinafter, embodiments of a semiconductor device, a method for manufacturing the same, and a composite semiconductor device in which a diode is connected in parallel according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. In addition, in the accompanying drawings described in the embodiments, for ease of viewing or understanding, a scale and a dimensional ratio are different from the actual scale and dimensional ratio. The invention is not limited to the following embodiments as long as it does not depart from the scope and spirit thereof.

Embodiment 1

Figure 1B:
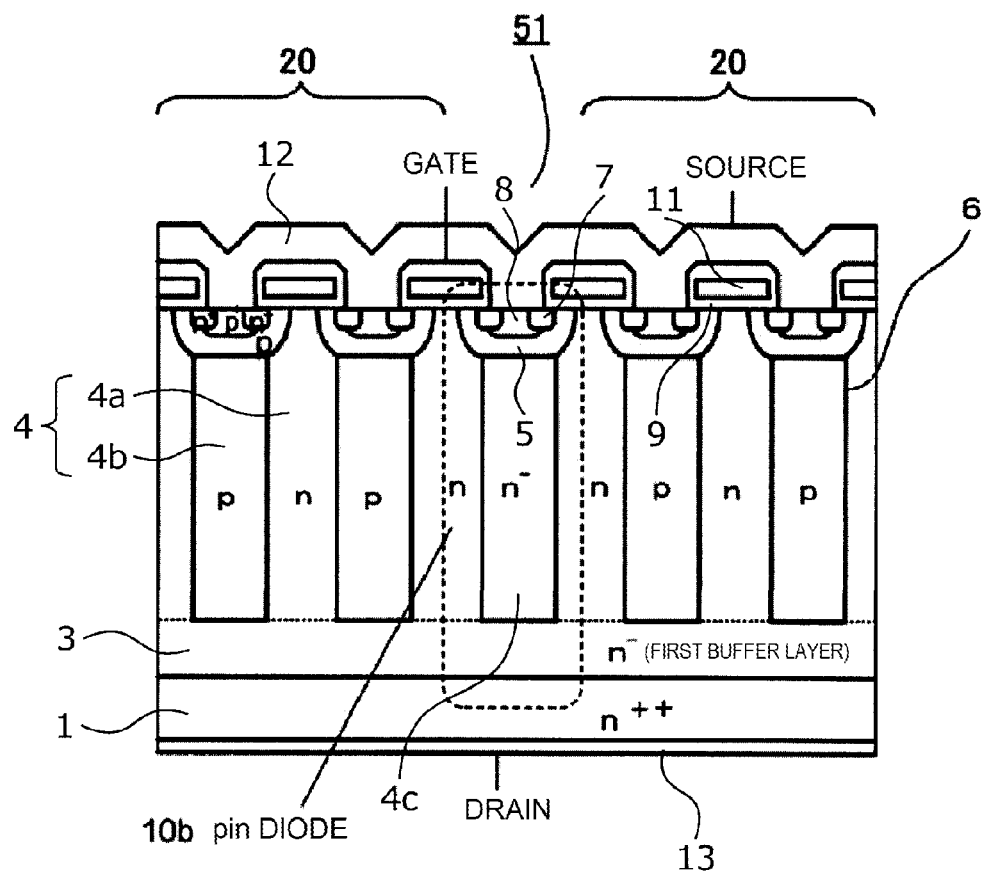

FIGS. 1A and 1B are cross-sectional views illustrating a main part of a super junction MOSFET according to Embodiment 1 of the invention in which a p-type partition region in a parallel pn layer is replaced with an n-type region having a lower impurity concentration than an n-type drift region. FIGS. 1A and 1B are cross-sectional views illustrating a main part of an active portion of an element in each of vertical super junction MOSFETs 50 and 51 according to the invention. The vertical super junction MOSFETs 50 and 51 illustrated in FIGS. 1A and 1B have a super junction (SJ) structure in which a drift layer is a parallel pn layer 4 including an n-type region (n-type drift region) 4a with high impurity concentration and a p-type region (p-type partition region) 4b which are alternately arranged in a direction parallel to the main surface of a substrate. That is, the vertical super junction MOSFETs 50 and 51 have a plurality of pn junctions 6 which are formed by the n-type drift regions 4a and the p-type partition regions 4b forming the parallel pn layer 4, extend in a direction (the depth direction of the substrate) perpendicular to the main surface of the substrate, and are parallel to each other. FIG. 1A illustrates the vertical super junction MOSFET 50 with an SJ structure in which a plurality of regions of some p-type partition regions 4b in the parallel pn layer 4 are $n^-$ regions 4c having a lower impurity concentration than the n-type drift region 4a. The vertical super junction MOSFET 50 includes a first $n^-$ buffer layer 3 having the same impurity concentration as the $n^-$ region 4c and a second $n^+$ buffer layer 2 having a higher impurity concentration than the n-type drift region 4a of the parallel pn layer 4 which are arranged in this order from the parallel pn layer 4 between the parallel pn layer 4 and the $n^{++}$ drain layer 1.

FIG. 1B illustrates the vertical super junction MOSFET 51 with an SJ structure in which one p-type partition region 4b of the parallel pn layer 4 is the $n^-$ region 4c having a lower impurity concentration than the n-type drift region 4a. The vertical super junction MOSFET 51 includes the first $n^-$ buffer layer 3 which is provided between the lower surface of the parallel pn layer 4 and the $n^{++}$ drain layer 1 and has the same impurity concentration as the $n^-$ region 4c. In addition, the vertical super junction MOSFETs 50 and 51 each include a general MOS gate (metal-oxide-semiconductor insulated gate) structure including a p-type base region 5, an $n^+$ source region 7, a $p^+$ contact region 8, a gate insulating film 9, and a gate electrode 11 and a source electrode 12, which are provided on the side of the parallel pn layer 4 opposite to the first $n^-$ buffer layer 3. A drain electrode 13 comes into contact with the $n^{++}$ drain layer 1. When the semiconductor device is turned on, a current flows in an active region (the active portion of the element) (the active region is in charge of current driving).

In each of the vertical super junction MOSFETs 50 and 51 illustrated in FIGS. 1A and 1B, some of the p-type partition regions 4b in the parallel pn layer 4 are the $n^-$ regions 4c. Therefore, the vertical super junction MOSFETs 50 and 51 include pin diodes 10a and 10b and MOSFET regions 20, respectively. The pin diode 10a includes the p-type base region 5, the $n^-$ region 4c, the first $n^-$ buffer layer 3, and the second $n^+$ buffer layer 2 and the pin diode 10b includes the p-type base region 5, the $n^-$ region 4c, and the first $n^-$ buffer layer 3.

Since the vertical super junction MOSFETs 50 and 51 according to the invention have the above-mentioned structures, it is possible to operate the pin diodes 10a and 10b, without reducing a breakdown voltage. In addition, the number of pin diodes 10a and 10b illustrated in FIGS. 1A and 1B can be changed to adjust the degree of soft recovery. As the number of pin diodes increases, the effect of soft recovery is improved. In addition, in the pin diodes 10a and 10b, the impurity concentration of each $n^-$ region 4c is suppressed to a sufficiently small value to ensure the breakdown voltage. Therefore, the position where the pin diodes 10a and 10b are arranged is not limited and the $n^-$ regions 4c may be adjacent to each other, with the n-type drift region 4a interposed therebetween.

In the super junction MOSFET 50 illustrated in FIG. 1A, the second $n^+$ buffer layer 2 functions as a carrier reservoir during a reverse recovery operation of the super junction MOSFET 50. A carrier discharge time is lengthened to further increase the reverse recovery time and a soft recovery waveform is obtained.

Figure 7:
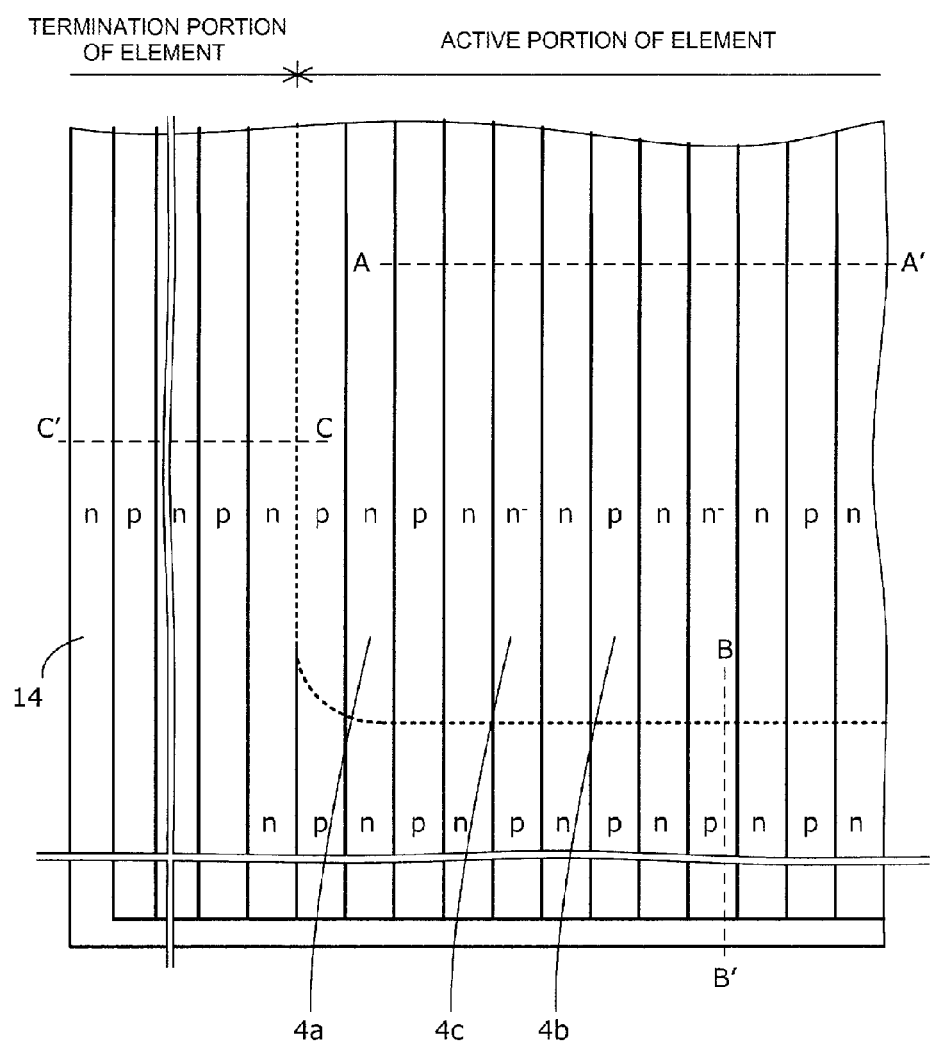
FIG. 7 is an example of a cross-sectional view illustrating a main portion of the plane pattern of the parallel pn layer which is cut along the plane parallel to the surface of a substrate in the super junction MOSFET according to the invention.
Figure 8A:
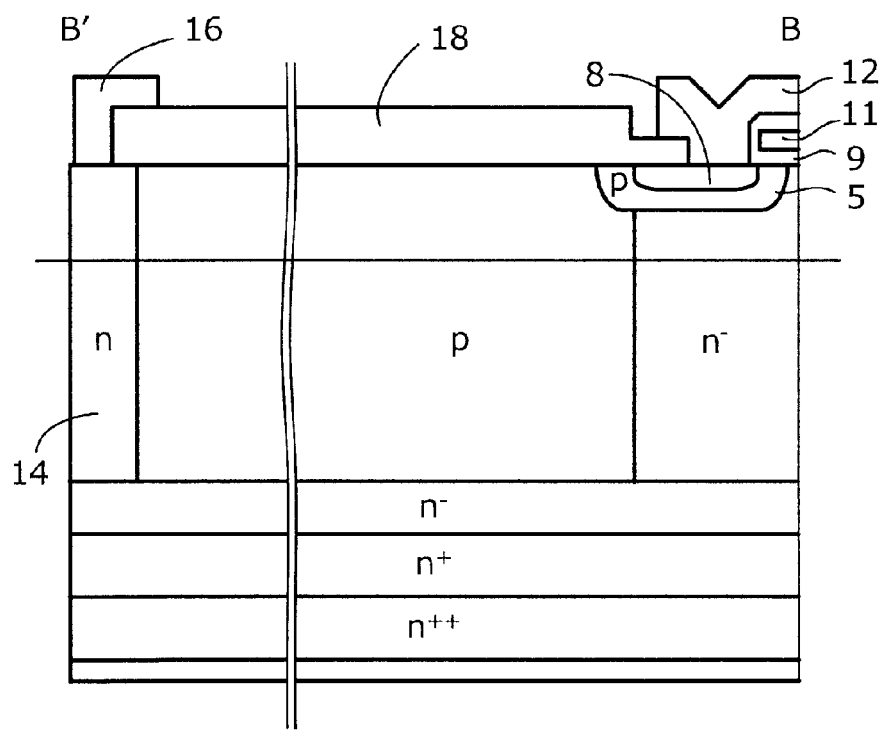
FIG. 8A is a cross-sectional view illustrating the main portion taken along the dashed line B-B' of FIG. 7
Figure 8B:
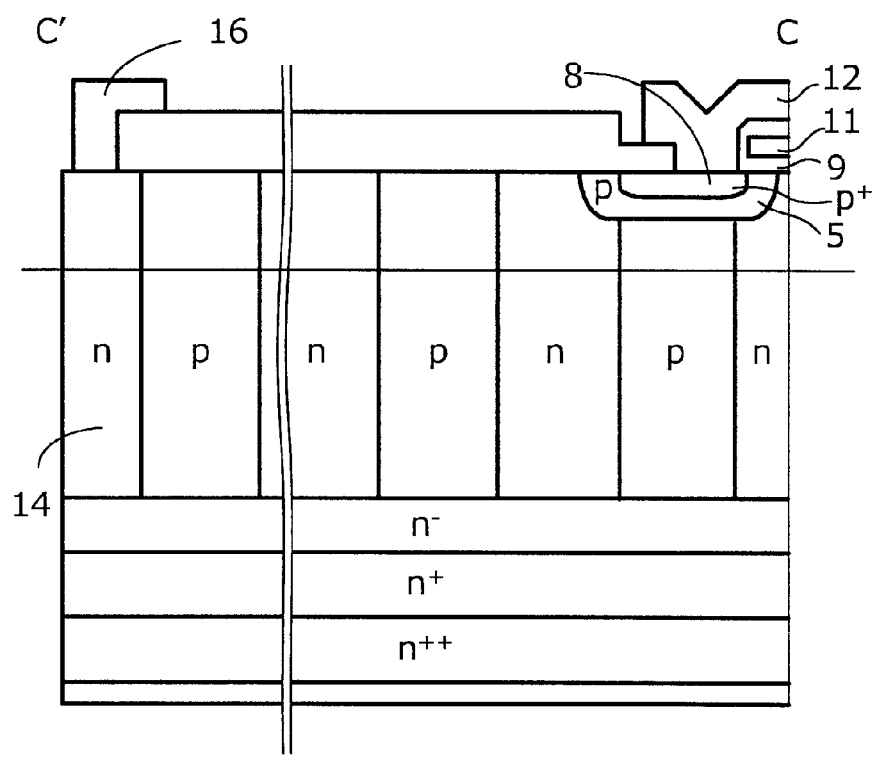
FIG. 8B is a cross-sectional view illustrating the main portion taken along the dashed line C-C' of FIG. 7.
Figure 9:
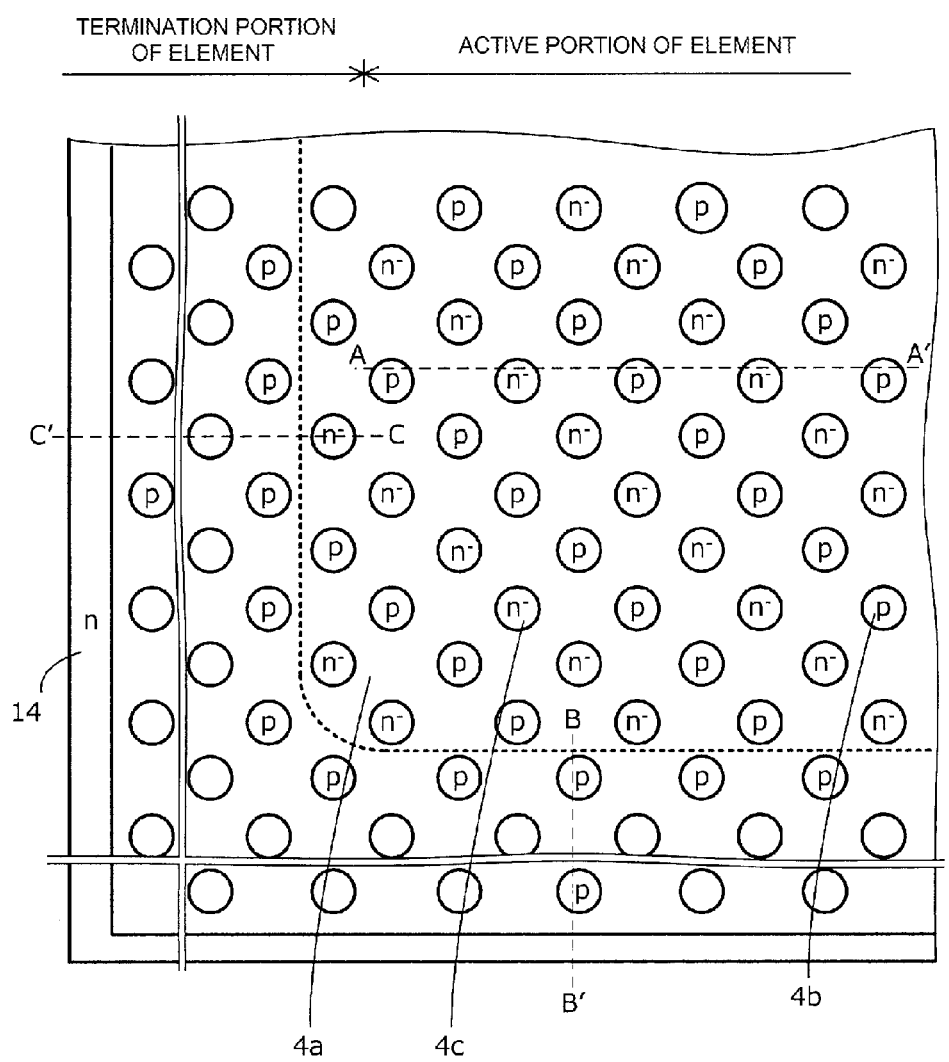
FIG. 9 is another example of the cross-sectional view illustrating the main portion of the plane pattern of the parallel pn layer which is cut along the plane parallel to the surface of the substrate in the super junction MOSFET according to the invention.
Figure 10A:
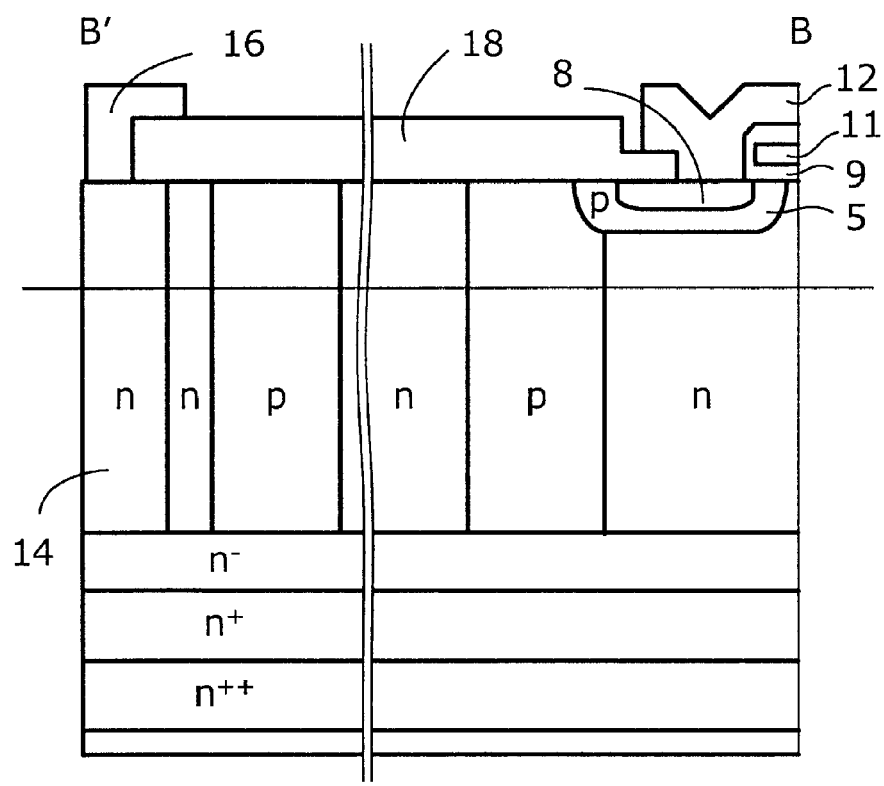
FIG. 10A is a cross-sectional view illustrating the main portion taken along the dashed line B-B' of FIG. 9
Figure 10B:
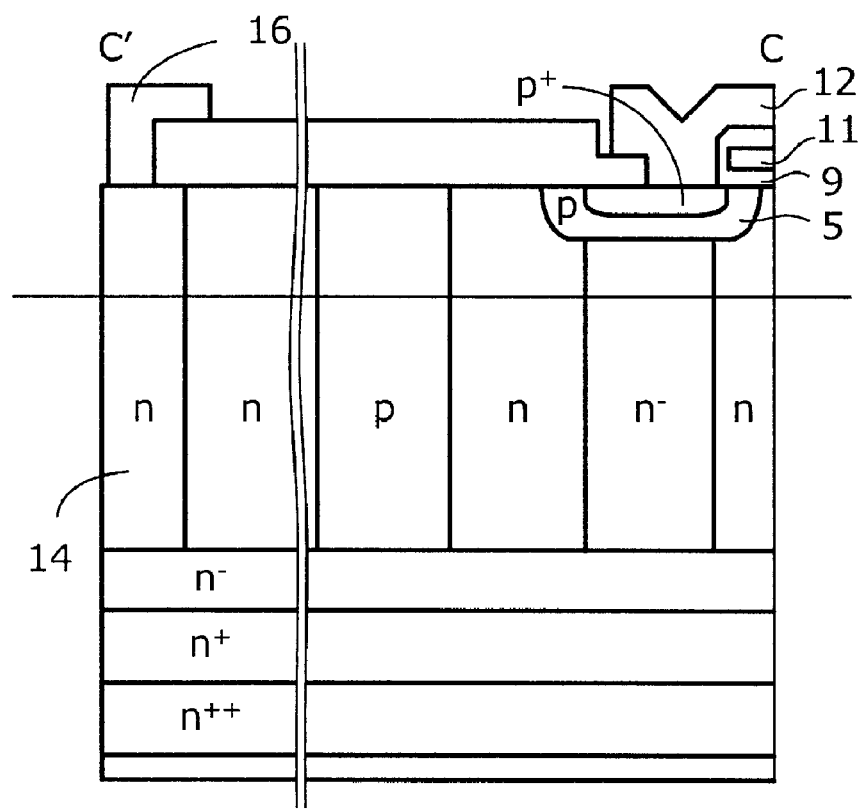
FIG. 10B is a cross-sectional view illustrating the main portion taken along the dashed line C-C' of FIG. 9.

FIG. 7 is an example of a cross-sectional view illustrating a main portion of the plane pattern of the parallel pn layer 4 which is cut along the plane parallel to the surface of the substrate in the super junction MOSFET 50 according to the invention. FIG. 8A is a cross-sectional view illustrating the main portion taken along the dashed line B-B' of FIG. 7 and FIG. 8B is a cross-sectional view illustrating the main portion taken along the dashed line C-C' of FIG. 7. FIG. 9 is another example of the cross-sectional view illustrating the main portion of the plane pattern of the parallel pn layer 4 which is cut along the plane parallel to the surface of the substrate in the super junction MOSFET 50 according to the invention. FIG. 10A is a cross-sectional view illustrating the main portion taken along the dashed line B-B' of FIG. 9 and FIG. 10B is a cross-sectional view illustrating the main portion taken along the dashed line C-C' of FIG. 9. In FIG. 7, the cross-sectional view taken along the dashed line A-A' corresponds to FIG. 1A, the cross-sectional view taken along the dashed line B-B' corresponds to FIG. 8A, and the cross-sectional view taken along the dashed line C-C' corresponds to FIG. 8B. In FIG. 9, the cross-sectional view taken along the dashed line A-A' corresponds to FIG. 1A, the cross-sectional view taken along the dashed line B-B' corresponds to FIG. 10A, and the cross-sectional view taken along the dashed line C-C' corresponds to FIG. 10B.

The plane pattern of the parallel pn layer 4 illustrated in FIG. 7 has a stripe shape which extends in a direction perpendicular to the direction in which the n-type drift regions 4a and the p-type partition regions 4b are arranged in a line. In the plane pattern of the parallel pn layer 4 illustrated in FIG. 9, the p-type partition regions 4b and the $n^-$ regions 4c are arranged in a lattice shape and each of the p-type partition regions 4b and the $n^-$ regions 4c is surrounded by the n-type drift region 4a. As described above, it is possible to appropriately change the number of $n^-$ regions 4c to be arranged. In addition, in FIG. 7 and FIG. 9, the $n^-$ region 4c is not formed at the edge of the element. A field insulating film 18 is provided on the surface of the parallel pn layer at the edge of the element. In addition, a channel stopper region 14 is provided in the outermost circumference of the edge of the element. A channel stopper electrode 16 is provided so as to be electrically connected to the channel stopper region 14.

Next, the characteristics of the vertical super junction MOSFET 50 with a breakdown voltage of about 600 V will be described in detail below. The dimensions and impurity concentration of each layer and each region will be described in brief below. The thickness of the parallel pn layer 4 in the depth direction (hereinafter, the thickness means a distance from the substrate in the depth direction) is 36.0 μm, the pitch between the parallel pn layers 4 is 12.0 μm, the width of each of the n-type drift region 4a and the p-type partition region 4b is 6.0 μm, and the impurity concentration of each region is $3.0 \times 10^{15}$ cm$^{-3}$. The first $n^-$ buffer layer 3 provided immediately below the parallel pn layer 4 (drain side) had a thickness of 9 μm and an impurity concentration of $1.0 \times 10^{15}$ cm$^{-3}$ which was lower than that of the n-type drift region 4a. The second $n^+$ buffer layer 2 provided below the first $n^-$ buffer layer 3 was set to a thickness of 15 μm and an impurity concentration of $1.0 \times 10^{16}$ cm$^{-3}$, which was higher than that of the n-type drift region 4a, such that a depletion layer was not spread even during a reverse recovery operation. In addition, the impurity concentration of the $n^{++}$ drain layer 1 was $2.0 \times 10^{18}$ cm$^{-3}$.

Figure 4:
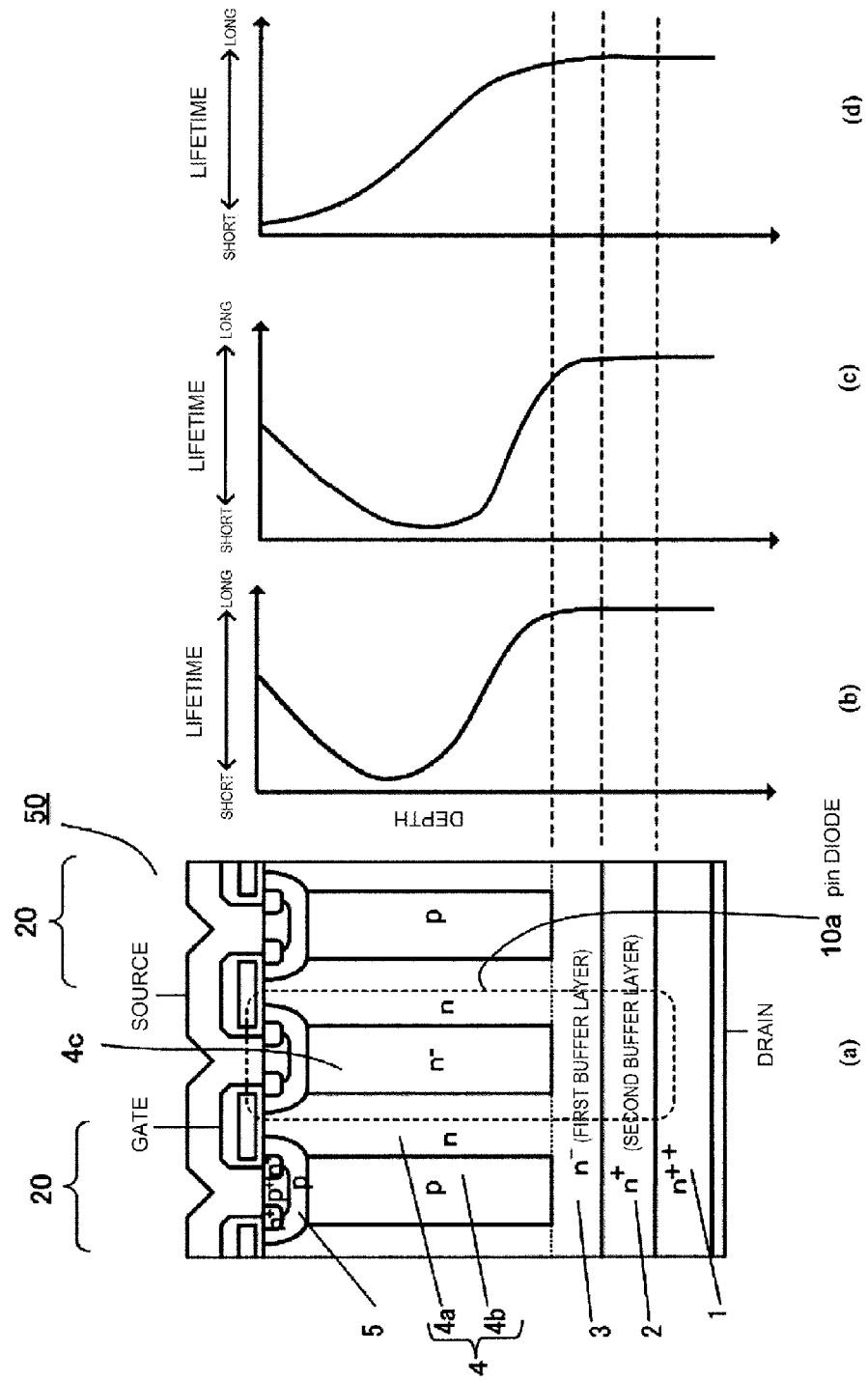
FIG. 4 is a diagram illustrating different carrier lifetime distributions of the super junction MOSFET according to Embodiment 1 of the invention.
Figure 5:
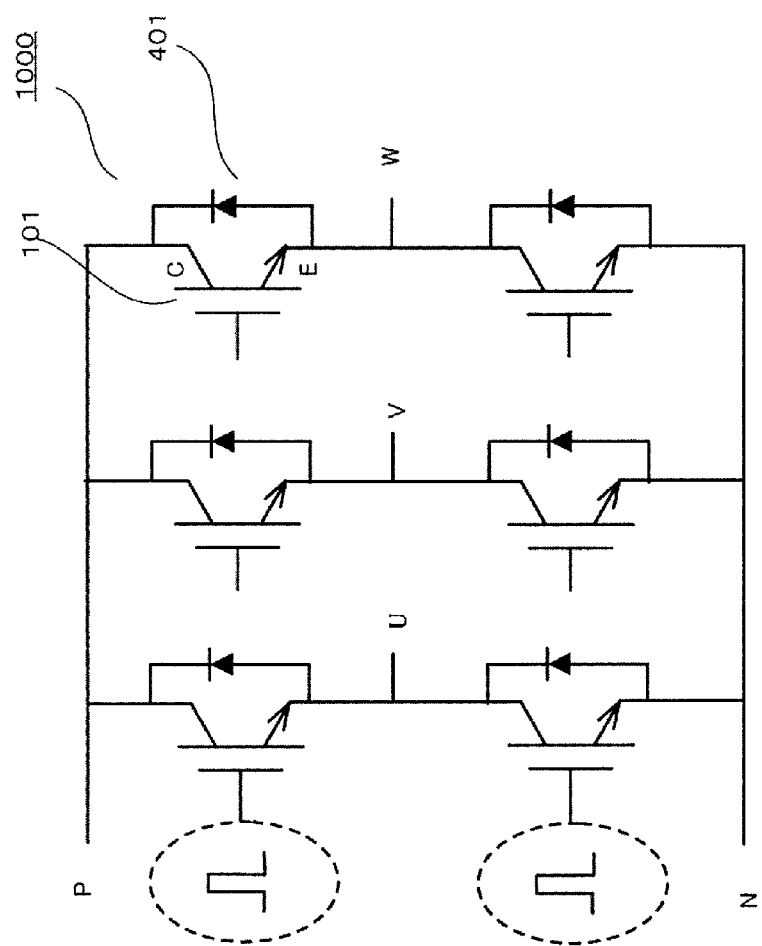
FIG. 5 is a circuit diagram illustrating a general inverter.
Figure 6A:
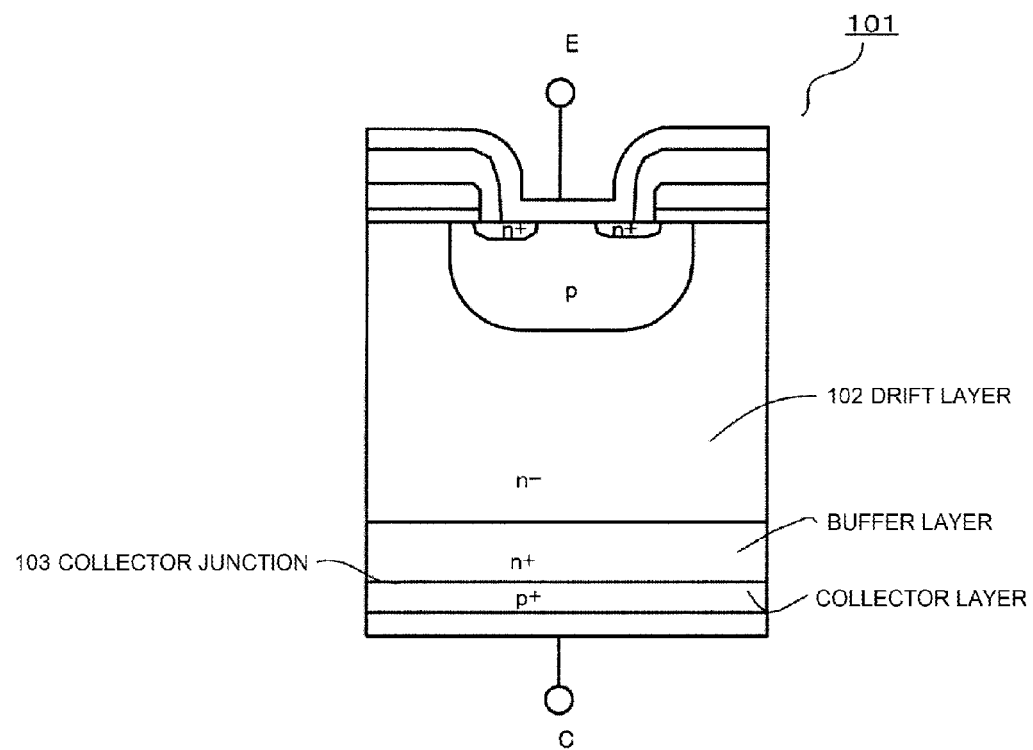
FIG. 6A is a cross-sectional view illustrating a main portion of a general IGBT and FIG. 6B is a cross-sectional view illustrating a main portion of a MOSFET.
Figure 6B:
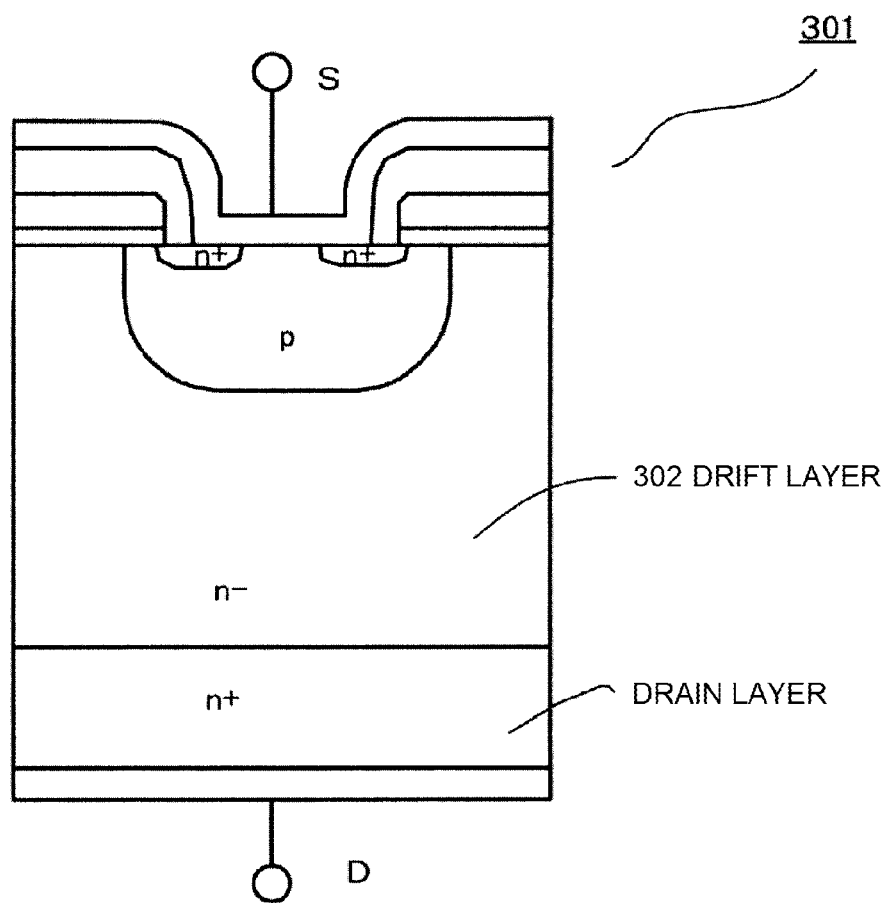

FIG. 4 is a diagram illustrating different carrier lifetime distributions of the super junction MOSFET according to Embodiment 1 of the invention. FIGS. 4(b) to 4(d) are diagrams illustrating the schematic carrier lifetime distributions of the vertical super junction MOSFET 50 illustrated in FIG. 4(a). In each case, the carrier lifetime of the second n$^+$ buffer layer 2 is not controlled or is not shorter than that of the parallel pn layer 4 and the first buffer layer 3. The carrier lifetime of any one or all of the regions other than the second buffer layer 2 is locally shortened to increase a switching speed. Basically, an electron lifetime was $1.0 \times 10^{-5}$ seconds and a hole lifetime was $3.0 \times 10^{-6}$ seconds. When the carrier lifetime was shortened, the minimum value of an electron carrier lifetime was $1.0 \times 10^{-7}$ seconds and the minimum value of a hole carrier lifetime was $3.0 \times 10^{-8}$ seconds. When a sufficient number of carriers are ensured in the second n$^+$ buffer layer 2, a soft recovery waveform is obtained during the reverse recovery operation. Therefore, high-speed switching and a soft recovery waveform are obtained by any of the distributions illustrated in FIGS. 4(b) to 4(d) in which the carrier lifetime of the second n$^+$ buffer layer 2 is longer than that of other regions.

In order to obtain the carrier lifetime distributions illustrated in FIGS. 4(b) and 4(c), for example, proton irradiation may be performed on the rear surface of the substrate and a heat treatment may be performed to locally control the lifetime such that the lifetime has a peak (is the shortest) at the depth from the front surface of the parallel pn layer 4 in FIG. 4(b) and has a peak at the depth from the rear surface of the parallel pn layer 4 in FIG. 4(c). In addition, when platinum (Pt) is used as a lifetime killer and ions are implanted into the rear surface (drain layer) of the substrate and is diffused by a heat treatment, a distribution in which the carrier lifetime has the shortest gradient on the front surface side as illustrated in FIG. 4(d) is obtained since platinum is likely to be segregated on the front surface side of the substrate.

Figure 3:
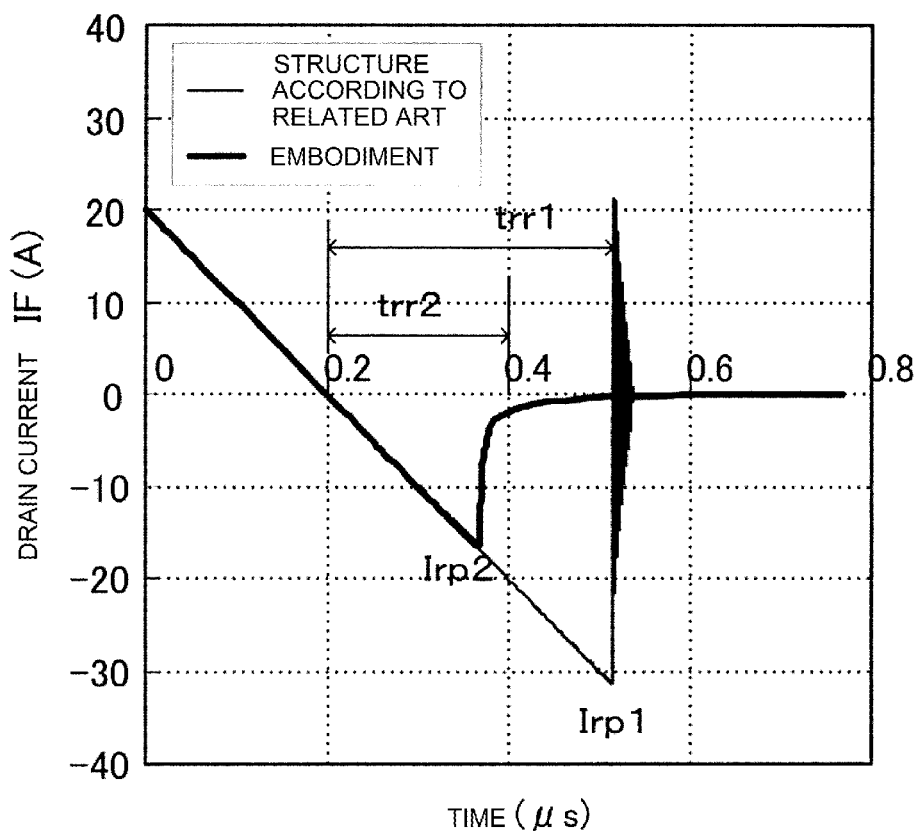
FIG. 3 is a diagram illustrating reverse recovery current waveforms corresponding to the super junction MOSFET having the structure according to the related art illustrated in FIGS. 2A and 2B and the super junction MOSFET according to Embodiment 1 of the invention illustrated in FIG. 1.

In order to clarify the effect of the vertical super junction MOSFET 50 (FIG. 4(a)) according to the invention having the carrier lifetime distribution illustrated in FIG. 4(b), the recovery waveform of the super junction MOSFET 201 (FIG. 2A) according to the related art having the carrier lifetime distribution illustrated in FIG. 2B in which the carrier lifetime was not adjusted was measured. The measurement result is illustrated in FIG. 3. FIG. 3 is a diagram illustrating reverse recovery current waveforms corresponding to the super junction MOSFET according to the related art illustrated in FIG. 2 and the super junction MOSFET according to Embodiment 1 of the invention illustrated in FIG. 1. FIG. 3 illustrates the simulation results of the reverse recovery current waveform when a power supply voltage is 400 V, a forward current is 20 A, and a change in reverse current over time is 100 A/μs for the super junction MOSFETs 50 and 201. For the super junction MOSFET 50 illustrated in FIG. 4(a), helium (He) was used as the lifetime killer, ions were implanted into the rear surface (drain layer) of the substrate, and a heat treatment was performed to control the lifetime. In addition, a concentration profile in which concentration had a peak at a depth of 8 μm from the source-side surface of the parallel pn layer 4 was set. The area of the pin diode 10a in the active region of the super junction MOSFET 50 illustrated in FIG. 4(a) was equal to that of the MOSFET region 20.

As can be seen from FIG. 3, the super junction MOSFET 201 according to the related art has a hard recovery waveform in which a reverse recovery time trr1 is long and a reverse recovery current has a high peak Irp1, increases rapidly, and largely oscillates. The reason is that, in a forward blocking state, carriers are likely to be depleted with the spreading of the depletion layer during reverse recovery since both the second buffer layer and the built-in pin diode are not provided.

In contrast, the super junction MOSFET 50 according to the invention (which is illustrated as Embodiment in FIG. 3) includes the built-in pin diode and the second buffer layer which has a higher impurity concentration than the drift region in the parallel pn layer. According to this structure, a large number of carriers are injected by the pin diode and the second buffer layer functions as a carrier reservoir during a reverse recovery operation, which results in an increase in the total number of carriers. Therefore, the amount of reverse recovery current (Irp) increases and the reverse recovery time is lengthened. As a result, a soft recovery waveform is obtained.

From the above-mentioned results, in Embodiment 1, the soft recovery waveform of the super junction MOSFET is obtained, the reverse recovery operation is performed at a high speed, and loss is reduced. In addition, in Embodiment 1 of the invention, after the second n$^+$ buffer layer 2 and the n-type first buffer layer 3 are formed on the high-concentration n$^{++}$ drain layer 1 (only the n-type first buffer layer 3 is formed in the super junction MOSFET 51), the parallel pn layer 4 is formed by a multi-stage epitaxial method in which epitaxial growth and photolithography are repeatedly performed a plurality of times to sequentially stack the parallel pn layers 4 in the same pattern to a necessary thickness. In addition, a trench filling method may be used instead of the multi-stage epitaxial method. When the parallel pn layer 4 is formed by the trench filling method, first, the second n$^+$ buffer layer 2, the n-type first buffer layer 3, and a drift layer with a necessary thickness are formed on the high-concentration n$^{++}$ drain layer 1 by epitaxial growth. Then, a vertical trench with a depth corresponding to the thickness of the parallel pn layer is formed by anisotropic etching and an n$^-$ silicon layer, which will be the n$^-$ region 4c, is formed in the trench by epitaxial growth so as to fill up the trench. Then, the surface is planarized such that the drift layer is exposed. Then, a vertical trench with a depth corresponding to the thickness of the parallel pn layer is formed again and a p-type silicon layer, which will be the p-type partition region 4b, is formed by epitaxial growth. In this way, the parallel pn layer 4 is formed. A MOS gate structure, the source electrode 12, and the rear-surface-side drain electrode 13 are formed on the parallel pn layer 4 which is formed by any of the above-mentioned methods. In this way, a wafer process for the super junction MOSFET according to Embodiment 1 of the invention is almost completed. In addition, the manufacturing method according to the related art can be applied to the method for manufacturing the parallel pn layer 4 and the subsequent wafer process.

In general, in a power diode, as a method for shortening the carrier lifetime, a method has been used which introduces the lifetime killer for forming a level in the band gap, using, for example, the addition of heavy metal, such as gold (Au) or platinum (Pt) or irradiation with charged particles, such as electron beams or protons. As such, when the lifetime killer is introduced, the extinction of carriers in the diode is accelerated during the reverse recovery operation and the peak current Irp or the reverse recovery time trr during reverse recovery is reduced. As a result, loss can be reduced during reverse recovery. Since the super junction MOSFET also includes the built-in diode, the above-mentioned structure in which the lifetime killer is introduced to obtain the carrier lifetime distributions illustrated in FIGS. 4(b) to 4(d) is effective in increasing the operation speed and reducing reverse recovery loss.

In the super junction MOSFET 50 according to the invention, the second buffer layer 2 having a higher impurity concentration than the n-type drift region 4a of the parallel pn layer 4 is formed below the first buffer layer 3. In addition, the carrier lifetime of the first buffer layer 3 and the parallel pn layer 4 is adjusted to be shorter than the carrier lifetime of the second buffer layer 2. When the carrier lifetime is adjusted in this way, the recovery waveform can be gently raised and a soft recovery waveform can be obtained.

As a method for locally controlling the lifetime, the addition of heavy metal, such as gold or platinum, or irradiation with charged particles, such as protons, can be performed. Heavy metal can be added up to the first buffer layer 3 by the implantation of heavy metal ions into the surface close to the source region 7 and a heat treatment. In addition, after the source electrode 12 is formed, the opposite side (rear surface) of the substrate can be ground and the first buffer layer 3 and the second buffer layer 2 can be formed. Then, heavy metal ions or charged particles can be radiated to the surface of the second buffer layer 2. In addition, the local lifetime control can be combined with a control process of uniformizing the lifetime, such as electron beam irradiation.

The impurity concentration and thickness of the second buffer layer 2 are adjusted to make the second buffer layer 2 function as a carrier reservoir which prevents the depletion layer from reaching the $n^{++}$ drain layer 1 even when the super junction MOSFET 50 is in a forward blocking state. Therefore, even during the reverse recovery operation, the carriers in the drift layer are not depleted and the reverse recovery waveform can be gently raised.

According to the above-described Embodiment 1, a portion of the partition region 4b in the super junction MOSFETs 50 and 51 is replaced with the region 4c which has the same conductivity type as the drift region 4a and has a lower impurity concentration than the drift region 4a. Therefore, it is possible to achieve soft recovery. In addition, in the super junction MOSFET 50, the buffer layer includes two layers, that is, the first buffer layer 3 and the second buffer layer 2 and the lifetime killer is introduced such that the lifetime of the first buffer layer 3 and the parallel pn layer 4 is shorter than that of the second buffer layer 2. Therefore, it is possible to further improve soft recovery, to reduce the peak current Irp or the reverse recovery time trr during reverse recovery, and to reduce loss during reverse recovery.

EXPLANATIONS OF LETTERS OR NUMERALS

1 $n^{++}$ DRAIN LAYER (FIRST-CONDUCTIVITY-TYPE HIGH-CONCENTRATION SEMICONDUCTOR SUBSTRATE)
2 SECOND BUFFER LAYER
3 FIRST BUFFER LAYER
4 PARALLEL pn LAYER
4a n-TYPE DRIFT REGION
4b p-TYPE PARTITION REGION
5 p-TYPE BASE REGION
6 pn JUNCTION
10a, 10b PIN DIODE
50, 201 SUPER JUNCTION MOSFET
101 IGBT
103 COLLECTOR JUNCTION
301 MOSFET
401 DIODE
1000 INVERTER CIRCUIT

What is claimed is:

1. A method for manufacturing a semiconductor device including a high-concentration buffer layer of a first conductivity type which is provided on a first main surface of a drain layer of the first conductivity type and has a higher impurity concentration than a drift region of the first conductivity type, a low-concentration buffer layer of the first conductivity type which is provided on the high-concentration buffer layer and has a lower impurity concentration than the drift region, and a parallel pn layer which is provided on the low-concentration buffer layer and in which the drift region of the first conductivity type and a partition region of a second conductivity type are alternately arranged, at least one of the partition regions being replaced with a first-conductivity-type region having a lower impurity concentration than the drift region, the method comprising:
a step of adjusting a carrier lifetime of the parallel pn layer to be shorter than a carrier lifetime of the high-concentration buffer layer, using addition of heavy metal or irradiation with a charged particle.

2. A method for manufacturing a semiconductor device including a parallel pn layer which is provided over a first main surface of a drain layer of a first conductivity type and in which a drift region of the first conductivity type and a partition region of a second conductivity type are alternately arranged, at least one of the partition regions being replaced with a first-conductivity-type region having a lower impurity concentration than the drift region, the method comprising:
a step of forming a high-concentration buffer layer of the first conductivity type, which has a higher impurity concentration than the drift region, on the first main surface of the drain layer;
a step of forming a low-concentration buffer layer of the first conductivity type, which has a lower impurity concentration than the drift region, on the high-concentration buffer layer;
a step of forming the parallel pn layer on the low-concentration buffer layer; and
a step of adding heavy metal or radiating a charged particle to the parallel pn layer such that a carrier lifetime of the parallel pn layer is shorter than a carrier lifetime of the high-concentration buffer layer.

3. A method for manufacturing a semiconductor device including a parallel pn layer which is provided over a first main surface of a drain layer of a first conductivity type and in which a drift region of the first conductivity type and a partition region of a second conductivity type are alternately arranged, at least one of the partition regions being replaced with a first-conductivity-type region having a lower impurity concentration than the drift region, the method comprising:
a step of forming the parallel pn layer on a front surface side of a semiconductor substrate;
a step of forming an element structure on the parallel pn layer on the front surface side of the semiconductor substrate;
a step of forming a low-concentration buffer layer of the first conductivity type, which has a lower impurity concentration than the drift region, on a rear surface side of the semiconductor substrate;
a step of forming a high-concentration buffer layer of the first conductivity type, which has a higher impurity concentration than the drift region, at a position that is shallower than the low-concentration buffer layer from a rear surface of the semiconductor substrate; and
a step of adding heavy metal or radiating a charged particle to the high-concentration buffer layer such that a carrier lifetime of the parallel pn layer is shorter than a carrier lifetime of the high-concentration buffer layer.

* * * * *